(12) United States Patent
Weigold et al.

(10) Patent No.: US 8,169,042 B2
(45) Date of Patent: *May 1, 2012

(54) INTEGRATED MICROPHONE

(75) Inventors: Jason W. Weigold, Newburyport, MA (US); John R. Martin, Foxborough, MA (US); Timothy J. Brosnihan, Natick, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/845,348

(22) Filed: Jul. 28, 2010

(65) Prior Publication Data

US 2010/0289097 A1   Nov. 18, 2010

Related U.S. Application Data

(63) Continuation of application No. 11/535,804, filed on Sep. 27, 2006, now Pat. No. 7,795,695, and a continuation-in-part of application No. 11/044,612, filed on Jan. 27, 2005, now abandoned.

(60) Provisional application No. 60/757,703, filed on Jan. 9, 2006.

(51) Int. Cl.
*G01L 9/00* (2006.01)
*H01L 21/00* (2006.01)
*G10K 13/00* (2006.01)

(52) U.S. Cl. ............................ 257/419; 438/53; 381/174

(58) Field of Classification Search .................. 257/419; 438/53; 381/174, 175, 158, 167
See application file for complete search history.

(56) References Cited

U.S. PATENT DOCUMENTS

| | | | |
|---|---|---|---|
| 6,936,524 B2 * | 8/2005 | Zhu et al. | 438/459 |
| 7,023,066 B2 * | 4/2006 | Lee et al. | 257/415 |
| 7,071,017 B2 * | 7/2006 | Suzuki | 438/52 |
| 7,202,101 B2 * | 4/2007 | Gabriel et al. | 438/53 |
| 7,346,178 B2 * | 3/2008 | Zhe et al. | 381/174 |
| 7,795,695 B2 * | 9/2010 | Weigold et al. | 257/419 |

* cited by examiner

*Primary Examiner* — William D Coleman
(74) *Attorney, Agent, or Firm* — Sunstein Kann Murphy & Timbers LLP

(57) ABSTRACT

A method of forming a microphone having a variable capacitance first deposits high temperature deposition material on a die. The high temperature material ultimately forms structure that contributes to the variable capacitance. The method then forms circuitry on the die after depositing the deposition material. The circuitry is configured to detect the variable capacitance.

14 Claims, 9 Drawing Sheets

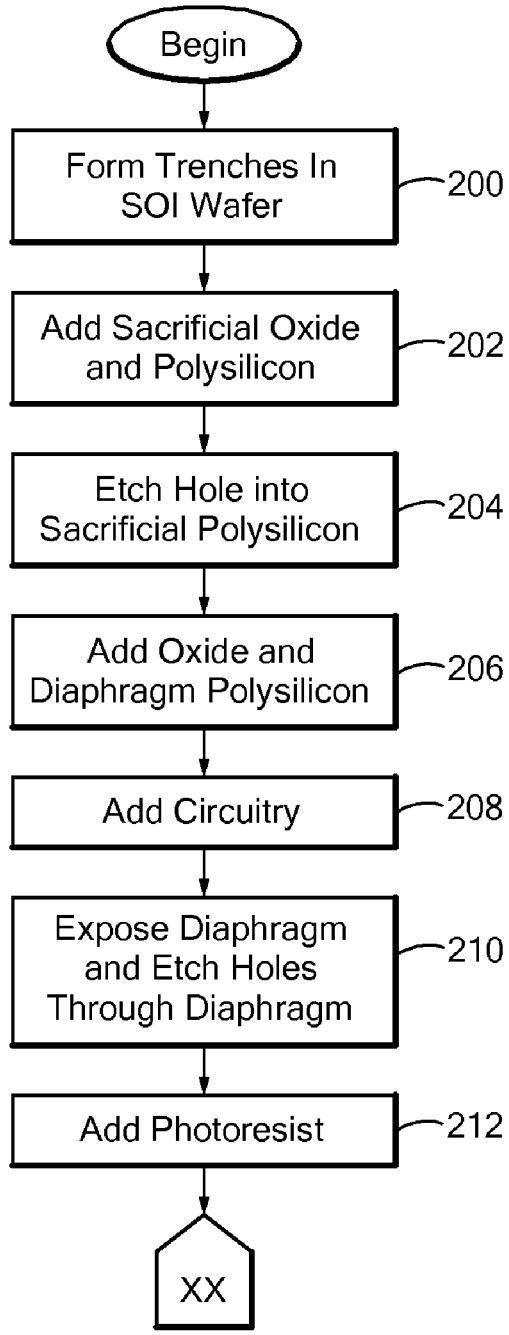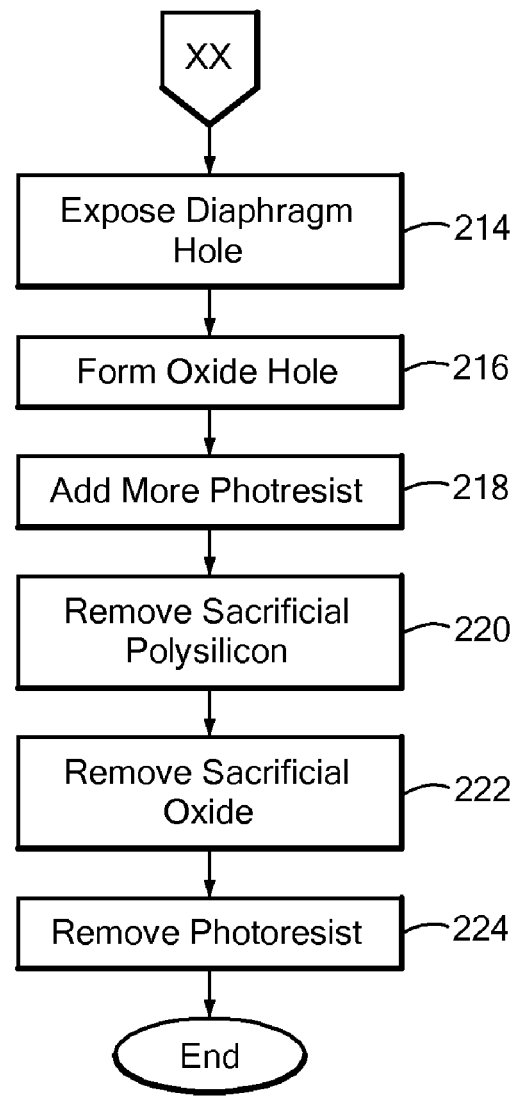
*FIG. 2A*  *FIG. 2B*

US 8,169,042 B2

INTEGRATED MICROPHONE

PRIORITY

This patent application is a continuation of U.S. patent application Ser. No. 11/535,804, filed Sep. 27, 2006, entitled, "INTEGRATED MICROPHONE," and naming Jason Weigold, John Martin, and Timothy Brosnihan as inventors, the disclosure of which is incorporated herein, in its entirety, by reference, and referred to as the "parent patent application."

The parent patent application claims priority from provisional U.S. patent application No. 60/757,703, filed Jan. 9, 2006, entitled, "INTEGRATED MICROPHONE," and naming John R. Martin, Jason W. Weigold, and Timothy J. Brosnihan as inventors, the disclosure of which is incorporated herein, in its entirety, by reference.

This parent patent application also is a continuation-in-part of U.S. patent application Ser. No. 11/044,612, filed Jan. 27, 2005, assigned publication number US2005/0255677, entitled, "INTEGRATED CIRCUIT WITH IMPURITY BARRIER," and naming Jason W. Weigold, Thomas D. Chen, Denis Mel O'Kane, Clair N. Leveugle, Stephen Alan Brown, and William A. Nevin as inventors, the disclosure of which is incorporated herein, in its entirety, by reference.

FIELD OF THE INVENTION

The invention generally relates to microphones and, more particularly, the invention relates to microphones and methods of producing microphones having both structure and circuitry.

BACKGROUND OF THE INVENTION

Microphones, such as MEMS microphones, typically have associated detection circuitry that detects diaphragm deflections and transmits such deflections to other circuitry for further processing. Forming such circuitry on the same die as the microphone, however, generally presents a number of challenges.

SUMMARY OF THE INVENTION

In accordance with one embodiment of the invention, a method of forming a microphone having a variable capacitance first deposits high temperature deposition material on a die. The high temperature material ultimately forms structure that contributes to the variable capacitance. The method then forms circuitry on the die after depositing the deposition material. The circuitry is configured to detect the variable capacitance.

The method also may form a released diaphragm, from the deposition material, on the die after forming circuitry on the die. Alternatively, or in addition, the method also may process the deposition material to form unreleased structure. The deposition material may comprise a number of materials, such as polysilicon. The die may be at least a part of a SOI wafer, or a part of single layer silicon wafer. In some embodiments, the microphone is a MEMS microphone.

In addition, the method also may add sacrificial material between the deposition material and the die, and then selectively remove portions of the deposition material and sacrificial material. This sacrificial material removal causes the deposition material to be suspended (after the circuitry is formed). Moreover, to deposit the material, the method may determine a temperature at which to deposit the deposition material as a function of the circuitry to be formed on the die.

In accordance with another embodiment of the invention, a microphone apparatus has a SOI wafer with a microphone formed at least on a part of it. The microphone has a diaphragm and backplate that form a variable capacitor. The microphone apparatus also has circuitry formed on the SOI wafer. The circuitry is configured for detecting the capacitance of the variable capacitor.

In accordance with other embodiments of the invention, a method of forming a microphone first forms, on a die, circuitry for detecting a variable capacitance. Next, the method selects, as a function of the circuitry, a temperature for depositing a deposition material on the die. The method then selects the deposition material as a function of the temperature, and deposits the selected deposition material on the die (i.e., after forming the circuitry). The deposition material is a low temperature deposition material. The method then processes the deposition material to form structure.

Among other things, the deposition material may include silicon germanium. Moreover, if the circuitry generally can withstand temperatures up to a given temperature without malfunctioning, then the given deposition temperature should be less than the given temperature.

BRIEF DESCRIPTION OF THE DRAWINGS

The foregoing advantages of the invention will be appreciated more fully from the following further description thereof with reference to the accompanying drawings wherein:

FIGS. 2A and 2B show an illustrative process of forming the microphone shown in FIGS. 1A and 1B in accordance with illustrative embodiments of the invention.

DESCRIPTION OF ILLUSTRATIVE EMBODIMENTS

In illustrative embodiments, a MEMS microphone has both structure and circuitry supported and/or formed at least in part by a silicon-on-insulator wafer ("SOI wafer"). In other embodiments, a method of forming a MEMS microphone deposits high temperature deposition material on a die before adding circuitry to the same die. Other embodiments, however, deposit low temperature deposition material on the die after forming circuitry on the same die. Details of illustrative embodiments are discussed below.

Figure 1A:
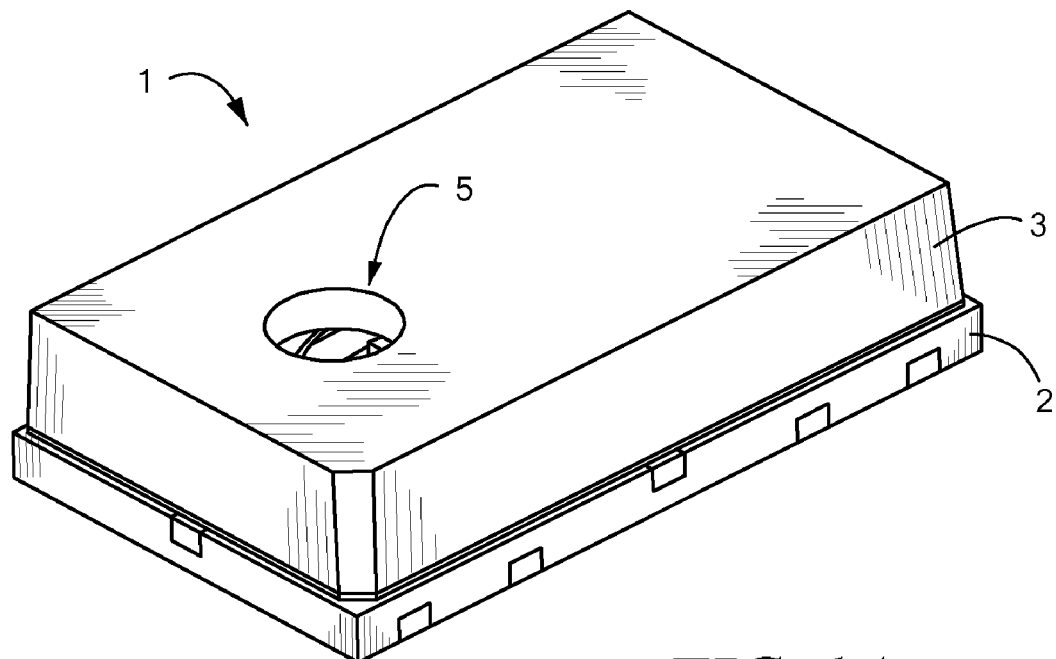
FIG. 1A schematically shows a perspective view of a packaged microphone that may be configured in accordance with illustrative embodiments of the invention.

FIG. 1A schematically shows a top, perspective view of a packaged microphone 1 that may be configured in accordance with illustrative embodiments of the invention. In a corresponding manner, FIG. 1B schematically shows a bottom, perspective view of the same packaged microphone 1.

The microphone 1 shown in those figures has a package base 2 that, together with a corresponding lid 3, forms an interior chamber containing a MEMS microphone chip 10 (discussed below, see FIGS. 2A-6D). The lid 3 in this embodiment is a cavity-type lid, which has four walls extending generally orthogonally from a top, interior face to form a cavity. The lid 3 secures to the top face of the substantially flat package base 2 to form the interior chamber.

The lid 3 also has an audio input port 5 that enables ingress of audio signals into the chamber. In alternative embodiments, however, the audio port 5 is at another location, such as through the package base 2, or through one of the side walls of the lid 3. Audio signals entering the interior chamber interact with the microphone chip 10 to produce an electrical signal that, with additional (exterior) components (e.g., a speaker and accompanying circuitry), produce an output audible signal corresponding to the input audible signal.

Figure 1B:
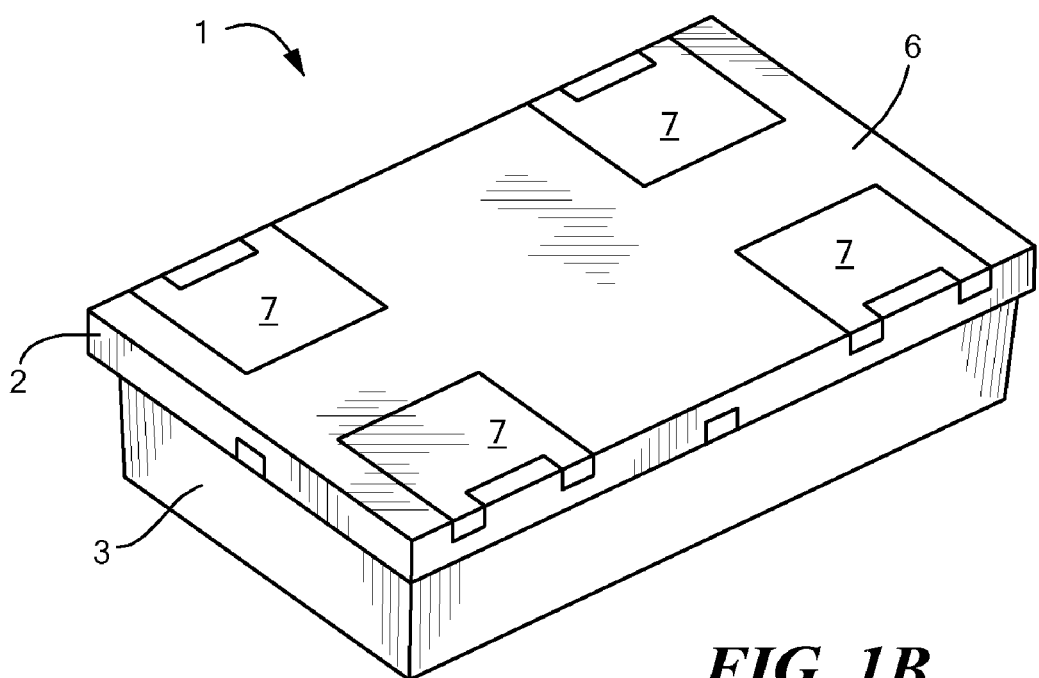
FIG. 1B schematically shows a bottom view of the packaged microphone shown in FIG. 1A.

FIG. 1B shows the bottom face 6 of the package base 2, which has a number of contacts 7 for electrically (and physically, in many anticipated uses) connecting the microphone with a substrate, such as a printed circuit board or other electrical interconnect apparatus. The packaged microphone 1 may be used in any of a wide variety of applications. For example, the packaged microphone 1 may be used with mobile telephones, land-line telephones, computer devices, video games, biometric security systems, two-way radios, public announcement systems, and other devices that transduce signals. In fact, it is anticipated that the packaged microphone 1 could be used as a speaker to produce audible signals from electronic signals.

In illustrative embodiments, the package base 2 is a premolded, leadframe-type package (also referred to as a "premolded package"). Other types of packages may be used, however, such as ceramic packages.

Figure 1C:
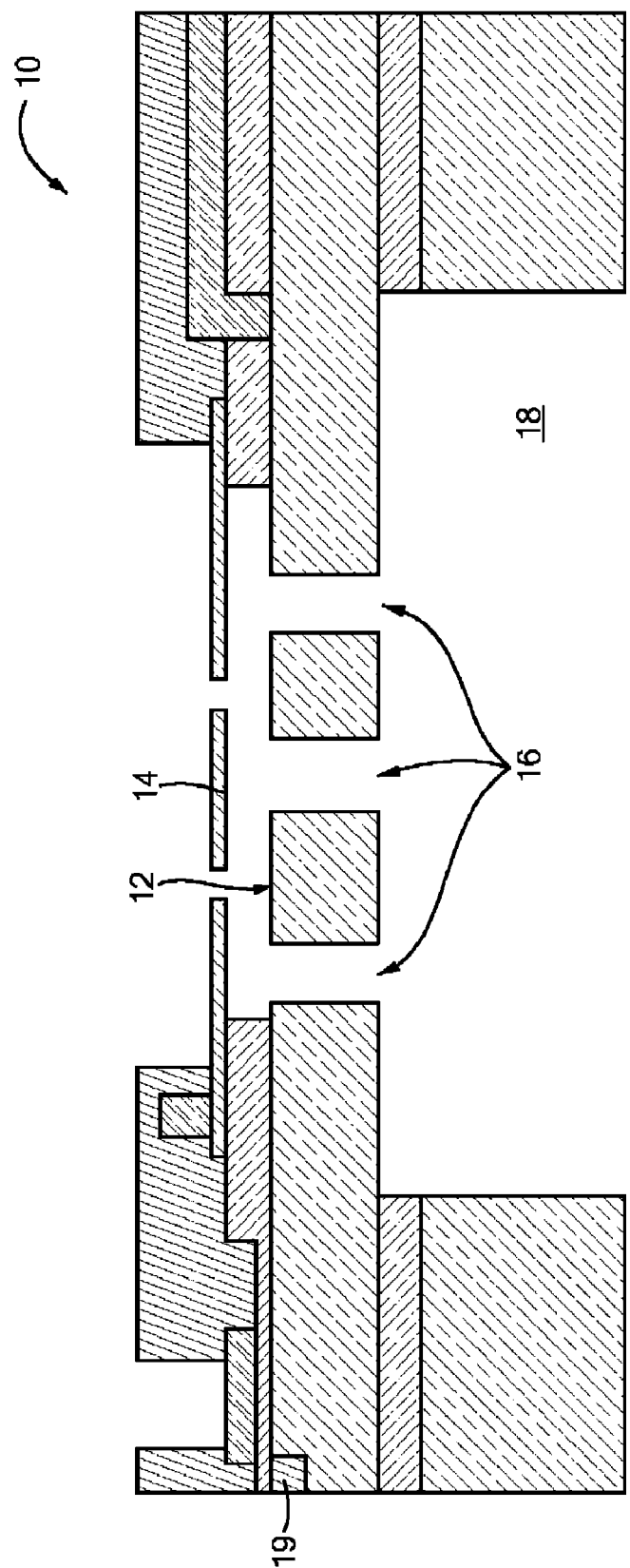
FIG. 1C schematically shows a cross-sectional view of an unpackaged MEMS microphone/microphone chip that may be produced in accordance with illustrative embodiments of the invention.

FIG. 1C schematically shows an unpackaged MEMS microphone 10 (also referred to as a "microphone chip 10") that may be produced in accordance with illustrative embodiments of the invention. Among other things, the microphone 10 includes a static backplate 12 that supports and forms a capacitor with a flexible diaphragm 14. In illustrative embodiments, the backplate 12 is formed from single crystal silicon (e.g., the top layer of a silicon-on-insulator wafer, as shown, or a single silicon wafer not bonded to any other wafers), while the diaphragm 14 is formed from deposited polysilicon or silicon germanium. To facilitate operation, the backplate 12 has a plurality of through-holes 16 that lead to a back-side cavity 18.

Audio signals cause the diaphragm 14 to vibrate, thus producing a changing capacitance. On-chip circuitry 19 converts this changing capacitance into electrical signals that can be further processed. Although the circuitry 19 is shown schematically as a box in a specific location on the microphone 10, it can be at any convenient location on the wafer and comprise conventional circuitry for detecting movement of the diaphragm. It should be noted that discussion of the microphone 10 shown in FIG. 1C is for illustrative purposes only. Other microphones thus may be used with illustrative embodiments of the invention.

FIG. 2 shows a process of forming the microphone 10 shown in FIG. 1C in accordance with illustrative embodiments of the invention. FIGS. 3A-3E illustrate various steps of this process. It should be noted that this process does not describe all steps required for forming the microphone 10. Instead, it shows various relevant steps for forming the microphone 10. Accordingly, some steps are not discussed.

Figure 3A:
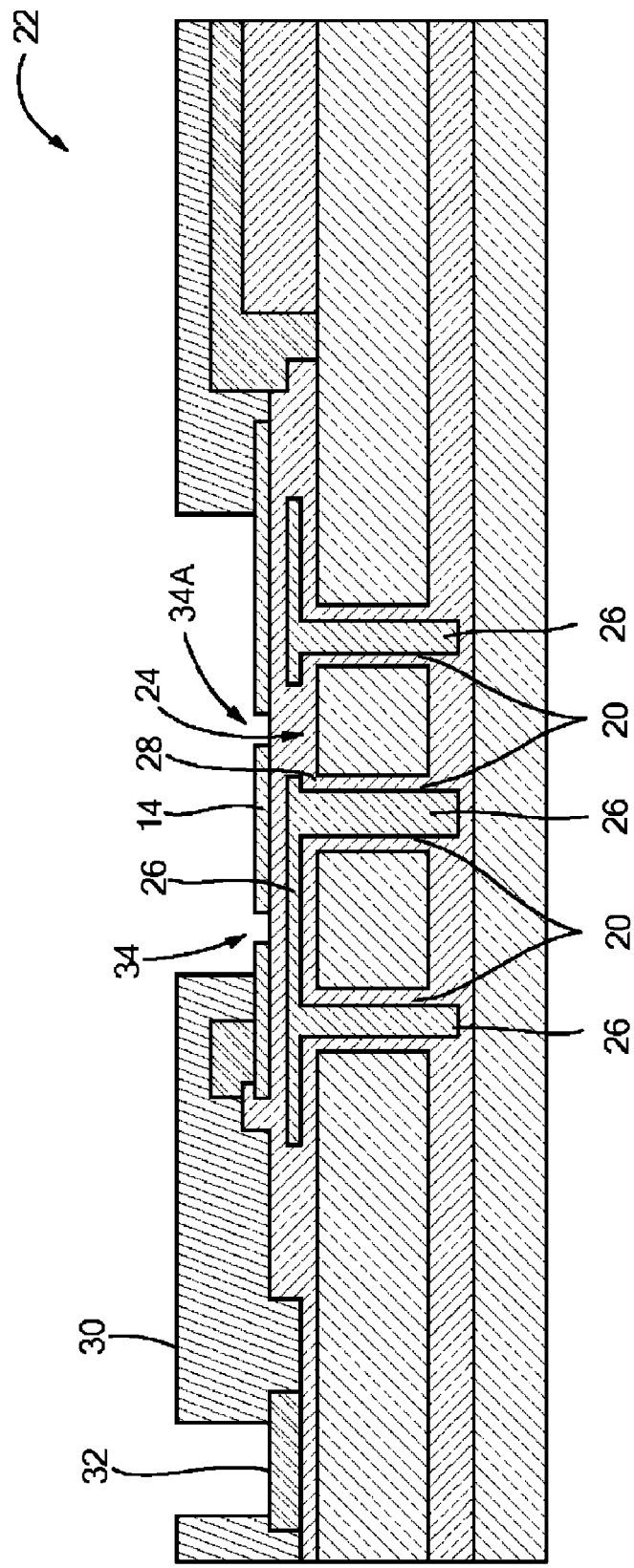
FIG. 3A schematically shows a cross-sectional view of the microphone during a stage of the method shown in FIG. 2A (steps 200-208).

The process begins at step 200, which etches trenches 20 in a silicon-on-insulator wafer ("SOI wafer"). FIG. 3A schematically shows an intermediate apparatus 22 illustrating this step, as well as steps 202-208. Next, the process adds sacrificial oxide 24 to the walls of the trenches 20 and along at least a portion of the top surface of the top layer of the SOI wafer (step 202). Among other ways, this oxide 24 may be grown or deposited. Continuing with step 202, the process then adds sacrificial polysilicon 26 to the oxide lined trenches 20 and top-side oxide 24.

After adding the sacrificial polysilicon 26, the process etches a hole 28 into the sacrificial polysilicon 26 (step 204). The process then continues to step 206, which adds more oxide 24 to substantially encapsulate the sacrificial polysilicon 26. In a manner similar to other steps that add oxide 24, this oxide 24 essentially integrates with other oxides in which it comes into contact. Continuing with step 206, the process then adds an additional polysilicon layer that ultimately forms the diaphragm 14.

The process continues to step 208, which adds circuitry to the microphone in a conventional manner. As noted above, the circuitry may be at any convenient location on the microphone 10. It should be noted that in some embodiments, the step of adding circuitry is performed at a later stage of the process. In either case, this embodiment adds circuitry at a time when no subsequent high temperature deposition materials are to be subsequently added. Such timing is advantageous to help ensure the integrity of the circuitry, which could become damaged at such high temperatures.

The process then both exposes the diaphragm 14, and etches holes 34 through the diaphragm 14 (step 210). As discussed below in greater detail, one of these holes ("diaphragm hole 34A") ultimately assists in forming a pedestal 42 that, for a limited time during this process, supports the diaphragm 14.

Various embodiments therefore consider a deposition material to be a "high temperature" material, or a "low temperature" material, as a function of the ability of the circuitry 19 to withstand certain temperatures. More specifically, if the deposition material normally is deposited at a specific temperature (or temperature range, both referred to simply as "temperature"), and that temperature is known to present a significant risk of damaging the specific circuitry 19 in issue while the temperature is at such level, then the deposition material is considered to be a "high temperature" material. For example, if the junctions and metal traces of certain active circuitry 19 can withstand temperatures of up to 400 degrees C. for the time required to deposit a material, then deposition materials deposited about at or above 400 degrees C. are considered to be "high temperature" materials for that process. An example of a high temperature material used in various embodiments is polysilicon.

Continuing with this example, deposition materials deposited below 400 degrees C. thus are considered to be "low temperature" materials. An example of a low temperature material used in various embodiments is silicon germanium. It nevertheless should be reiterated that discussion of 400 degrees C. is as an example only and not intended to limit various embodiments. Accordingly, in summary, the deposition temperature and its impact on the specific circuitry 19 determine whether the deposition material is "high temperature" or "low temperature" deposition material.

Those skilled in the art can use a number of methods for determining the capability of the circuitry 19 to withstand certain temperatures. Among other ways, one in the art may use software modeling algorithms to model the thermal cycling of the circuitry 19 and diffusions through the entire fabrication process. In addition, or alternatively, the circuitry 19 may be tested with actual testing processes. Based on these or other techniques known by those in the art, an appropriate deposition material may be selected.

Returning to FIG. 2, the process continues to step 212 by adding a photoresist layer 36, completely covering the diaphragm 14. After adding the photoresist, the process exposes the diaphragm hole 34A (step 214, FIG. 3B). To that end, the process forms a hole ("resist hole 38") through the photoresist by exposing that selected portion to light. This resist hole 38 illustratively has a larger inner diameter than that of the diaphragm hole 34A.

Figure 3B:
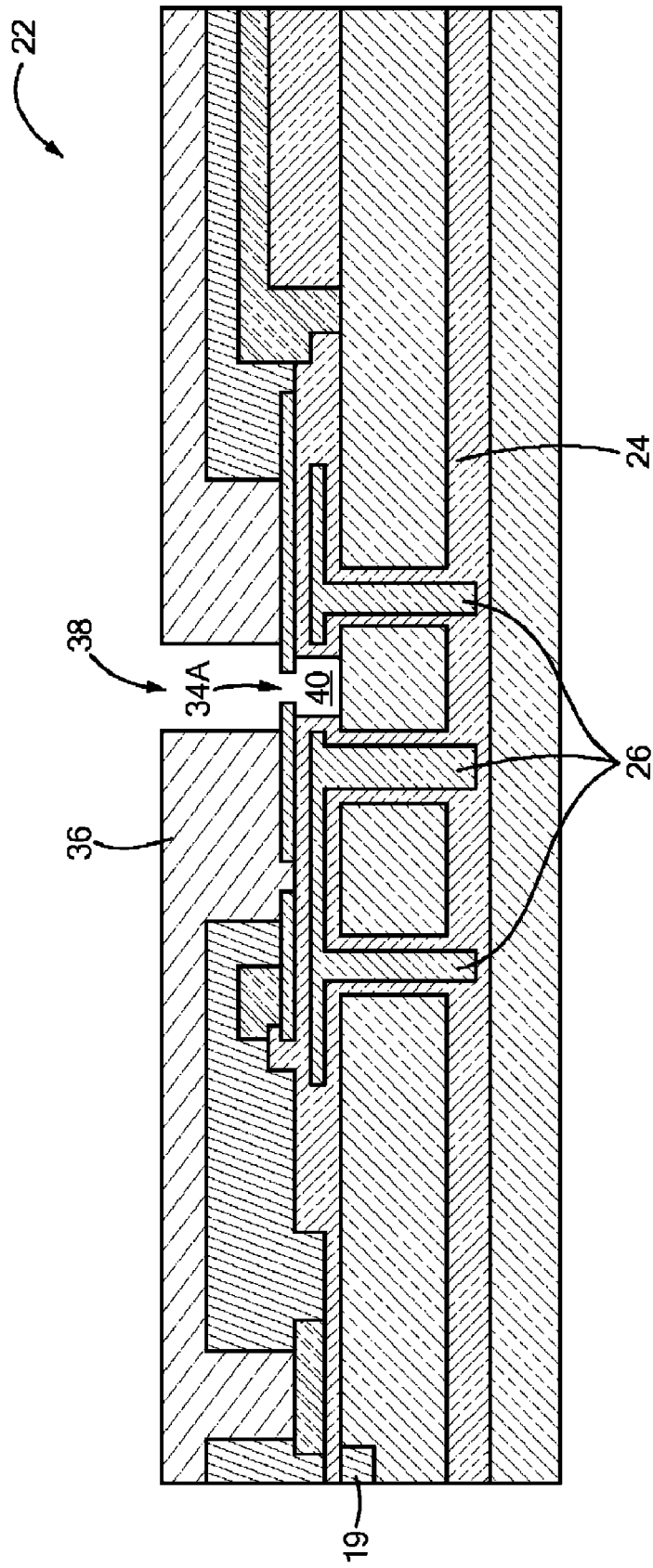
FIG. 3B schematically shows a cross-sectional view of the microphone during a stage of the method shown in FIG. 2B (step 216).

After forming the resist hole 38, the process forms a hole 40 through the oxide 24 (step 214, FIG. 3B). In illustrative embodiments, this oxide hole 40 extends to the top surface of the upper SOI wafer. It is expected that this oxide hole 40 first will have an inner diameter that is substantially equal to the inner diameter of the diaphragm hole 34A. A second step, such as an aqueous HF etch, may be used to enlarge the inner diameter of the oxide hole 40 to be greater than the inner diameter of the diaphragm hole 34A. This enlarged oxide hole diameter essentially exposes a portion of the bottom side of the diaphragm 14.

Figure 3C:
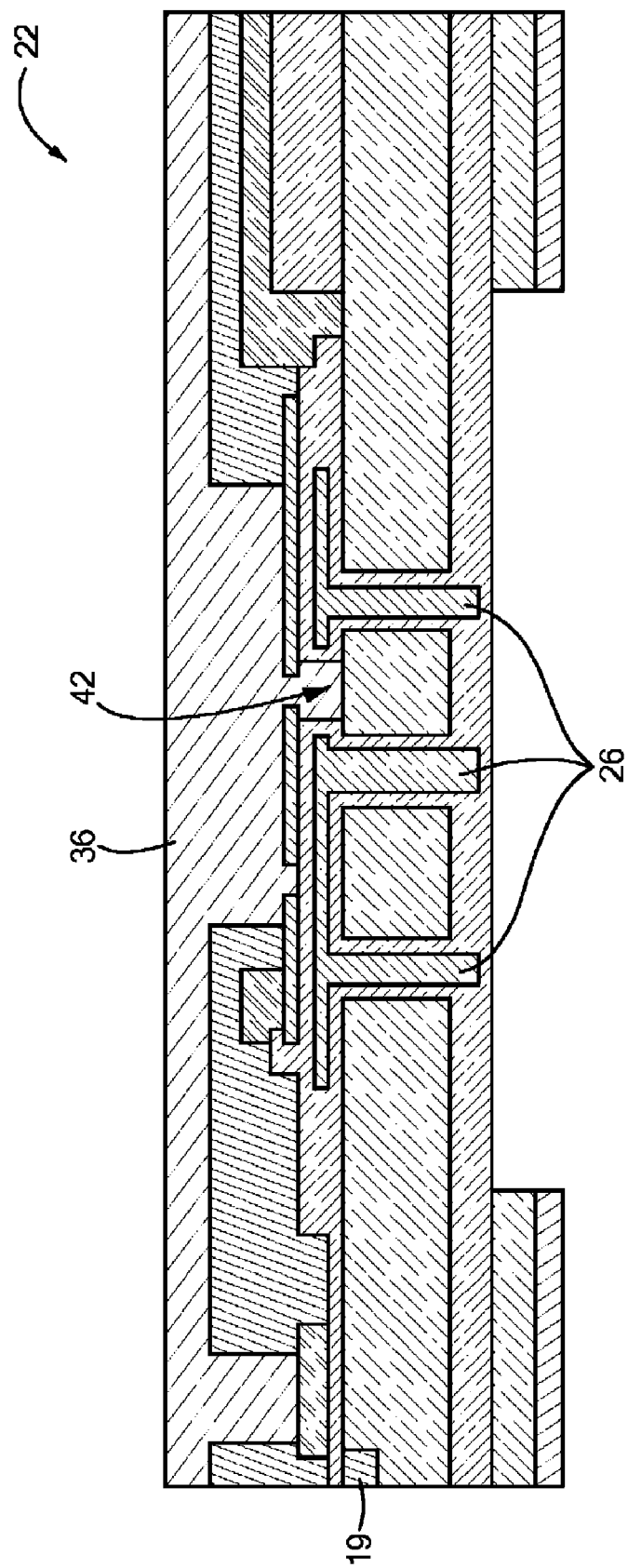
FIG. 3C schematically shows a cross-sectional view of the microphone during a stage of the method shown in FIG. 2B (step 218).

The process then continues to step 218, which adds more photoresist 36, to substantially fill the oxide and diaphragm holes 40 and 34 (FIG. 3C). The photoresist filling the oxide hole 40 contacts the silicon of the top SOI layer, as well as the underside of the diaphragm 14 around the diaphragm hole 34A.

At this point, the sacrificial materials may be removed. To that end, the process removes the sacrificial polysilicon 26 (step 220, FIG. 3D) and sacrificial oxide 24 (step 222, FIG. 3E). Among other ways, illustrative embodiments remove the polysilicon with a dry etch process, such as one using xenon difluoride. In addition, illustrative embodiments remove the oxide 24 with a wet etch process. Of course, other removal processes may be used.

Figure 3D:
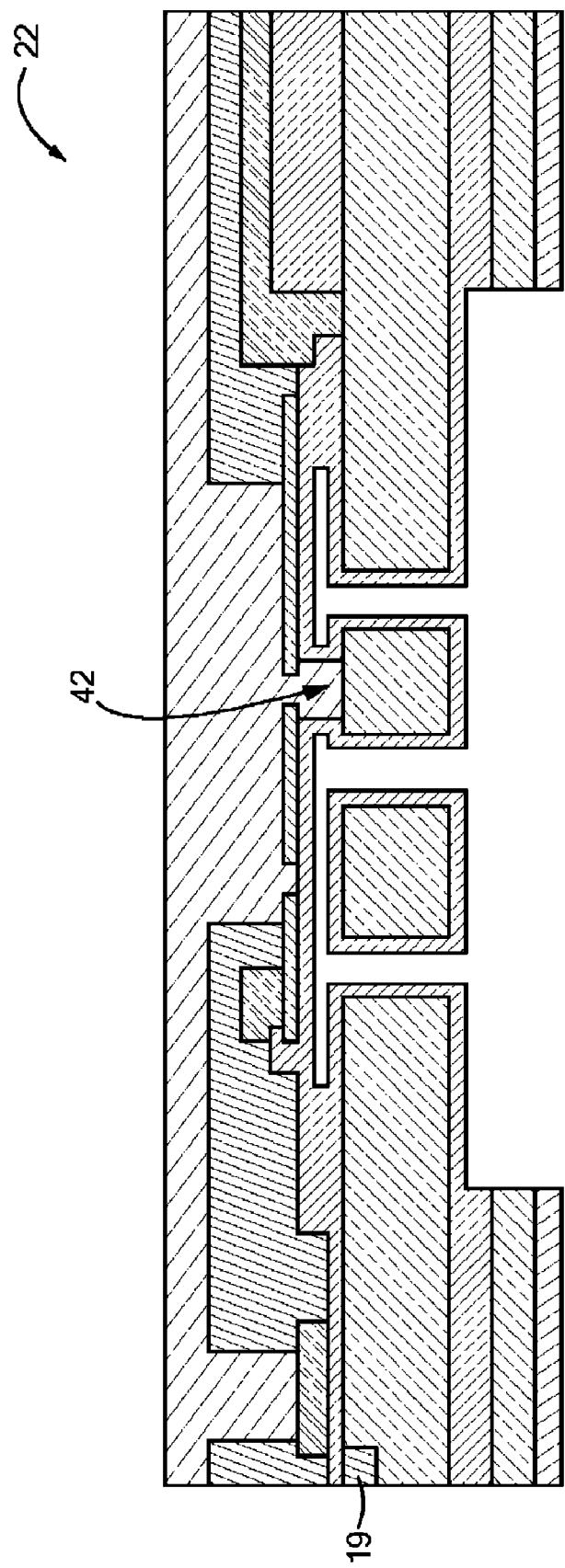
FIG. 3D schematically shows a cross-sectional view of the microphone during a stage of the method shown in FIG. 2B (step 220).
Figure 3E:
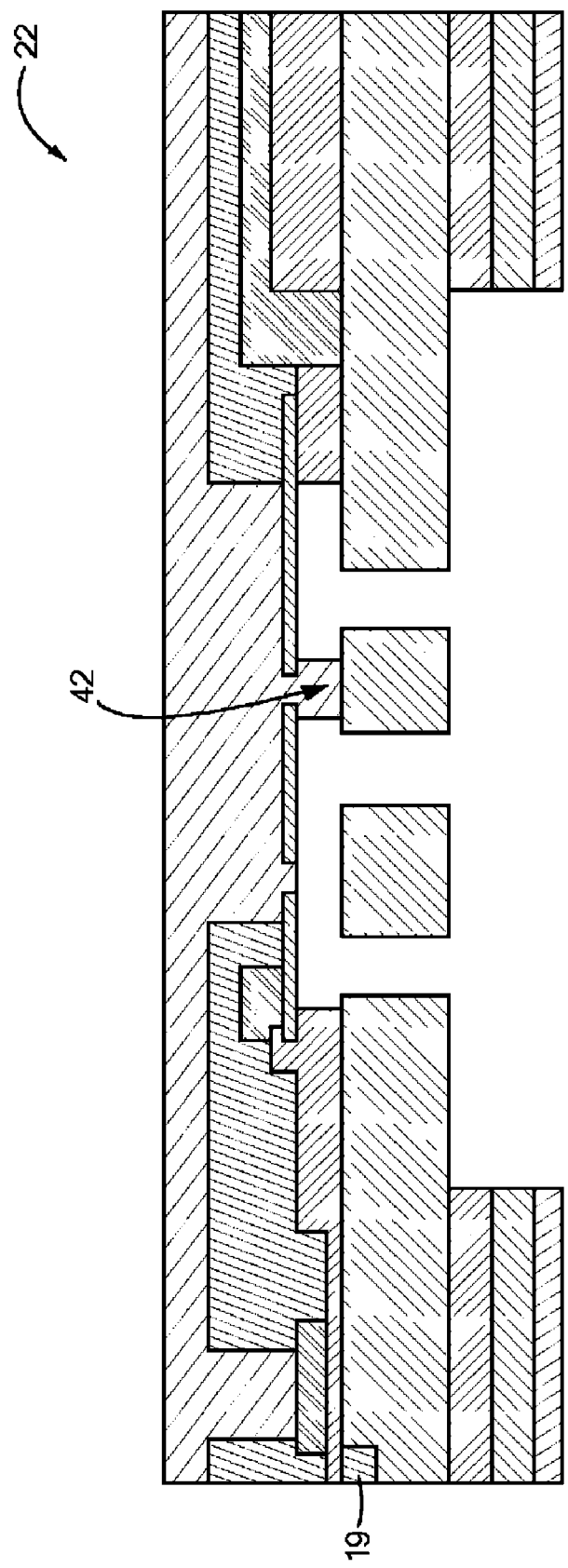
FIG. 3E schematically shows a cross-sectional view of the microphone during a stage of the method shown in FIG. 2B (step 222).

As shown in FIGS. 3D and 3E, the photoresist between the diaphragm 14 and top SOI layer supports the diaphragm 14. In other words, the photoresist at that location forms a pedestal 42 that supports the diaphragm 14. As known by those skilled in the art, the photoresist is substantially resistant to wet etch processes (e.g., aqueous HF process, such as those discussed above). It nevertheless should be noted that other such materials may be used. Discussion of photoresist thus is illustrative and not intended to limit the scope of all embodiments.

To release the diaphragm 14, the process continues to step 224, which removes the photoresist/pedestal 42. Among other ways, dry etch processes may be used. As noted above, other steps may be taken to complete production of the microphone 10. For example, if done in a batch process, the wafer may be diced to form a plurality of individual dies. It should be noted that when discussing various processes, the terms "wafer" and "die" may be used to mean the same thing, although a wafer may form a plurality of individual dies. Accordingly, unless explicitly stated otherwise, reference to depositing material on a die should be considered as a reference to depositing material on a wafer. In a like manner, reference to depositing material on a wafer should be considered as a reference to depositing material on a die.

Rather than using high temperature deposition materials, some embodiments implementing the process of FIG. 2 use low temperature deposition materials to form the structure. It should be reiterated, however, that various embodiments are not necessarily limited to many aspects of the process of FIG. 2. For example, the process may have been adapted to use a different sacrificial material, or not use the pedestal.

As discussed above, unlike the process discussed above, some embodiments implement post-processing methods for integrating a MEMS microphone on a die that already has appropriate circuitry. Among other ways, LPCVD processes and PECVD processes may suffice. A low temperature deposition material, such as silicon germanium, also may be used to enable this process.

Figure 4:
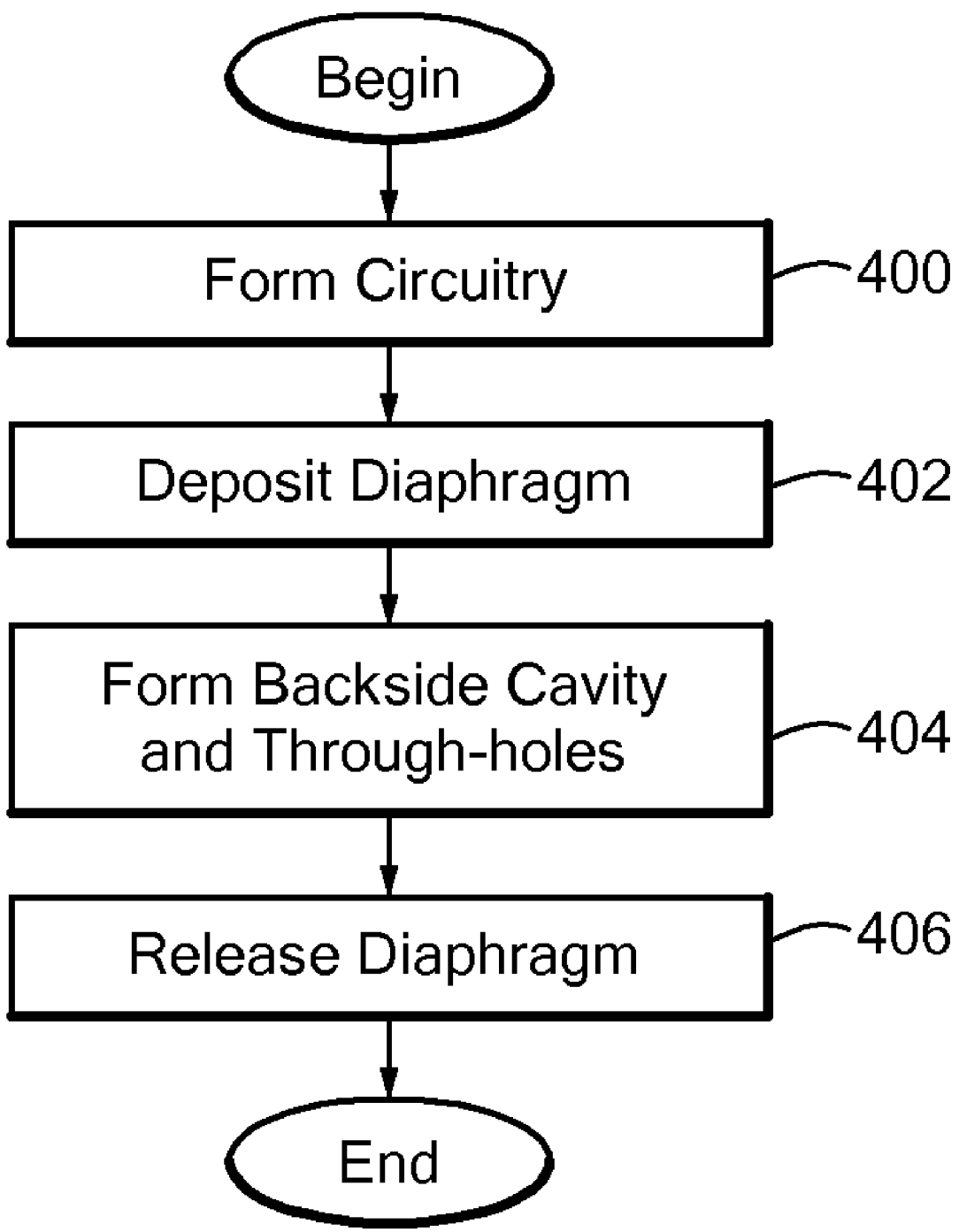
FIG. 4 shows a process of forming the microphone in accordance with other embodiments of the invention.

FIG. 4 shows a process of forming the microphone 10 discussed above in accordance with some embodiments of the invention. It should be noted that this process does not describe all steps required for forming the microphone 10. Instead, it shows various relevant steps for forming the microphone 10. Accordingly, some steps are not discussed. Moreover, the figures may include additional information relating to illustrative embodiments of the invention. Such information is not necessarily limiting to a number of embodiments.

The process begins at step 400, which forms circuitry 19, and associated components, on the SOI wafer. In a manner similar to other embodiments, the circuitry 19 may include conventional circuitry for detecting movement of the diaphragm 14 during operation.

After forming the circuitry 19, step 402 deposits diaphragm material on an exposed layer (i.e., deposited or grown on the top wafer of the SOI wafer) to form the unreleased diaphragm 14. As discussed above, this diaphragm 14 material illustratively is formed from a low temperature deposition material that should not impact circuit performance. For example, among other things, anticipated applications may use silicon germanium as the deposition material.

The process continues to step 404, which uses conventional micromachining processes to form the backside cavity 18 and through-holes 16. The process concludes at step 406 by releasing the diaphragm 14. The microphone 10 then may be secured in a conventional package, such as the package shown in FIGS. 1A and 1B.

This process of FIG. 4 is illustrative of one process that may use low temperature processes to form the microphone chip 10. It also may implement steps that are similar to those discussed above with regard to FIGS. 2A and 2B. Moreover, some steps may be performed differently. For example, the backside cavity 18 may be formed before processing the opposite side of the SOI wafer.

It should be reiterated that this process may be implemented on other types of wafers, such as single crystal silicon wafers. Accordingly, discussion of SOI wafers is illustrative and not intended to limit all embodiments of the invention. Moreover, rather than using the bottom SOI layer as the backplate 12, related processes may use the top SOI wafer as the backplate. Accordingly, the process shown in FIG. 2 may be modified to use principals of these low temperature deposition materials embodiments.

Among other benefits, such low temperature deposition material embodiments permit circuitry 19 to be formed on a wafer before forming the microstructure.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a microphone having a variable capacitance, the method comprising:
   depositing high temperature deposition material on a die;
   processing the high temperature material to form a variable capacitor, the high deposition material forming a diaphragm that is part of the variable capacitor, the variable capacitor producing at least part of the variable capacitance; and
   forming circuitry on the die after depositing the deposition material, the circuitry being configured to detect the variable capacitance.

2. The method as defined by claim 1 further wherein processing comprises releasing the diaphragm after forming circuitry on the die.

3. The method as defined by claim 1 wherein the deposition material is polysilicon.

4. The method as defined by claim 1 wherein processing comprises processing the deposition material to form an unreleased variable capacitor.

5. The method as defined by claim 1 wherein the die is a part of a SOI wafer.

6. The method as defined by claim 1 wherein the microphone is a MEMS microphone.

7. The method as defined by claim 1 processing comprises:
   adding sacrificial material to the die, the sacrificial material being between the deposition material and the die;
   selectively removing at least a portion of the deposition material; and
   selectively removing at least a portion of the sacrificial material to suspend the deposition material after forming the circuitry.

8. The method as defined by claim 1 wherein depositing comprises:
   determining a temperature at which to deposit the deposition material as a function of the circuitry to be formed on the die.

9. The apparatus formed by the process of claim 1.

10. The apparatus formed by the process of claim 7.

11. A microphone apparatus comprising:
    a SOI wafer;
    means for converting an audio signal to an electrical signal, the converting means being formed at least in part by the SOI wafer and having a diaphragm and backplate that form a variable capacitor means; and
    means for detecting the capacitance of the variable capacitor means, the detecting means being formed on the SOI wafer.

12. The microphone as defined by claim 11 wherein the diaphragm is formed from a high temperature deposition material.

13. The microphone as defined by claim 11 wherein the diaphragm is formed from a low temperature deposition material.

14. The microphone as defined by claim 11 wherein the backplate is formed by a portion of the SOI wafer.

* * * * *